United States Patent
Shigematsu et al.

(10) Patent No.: US 10,861,709 B2
(45) Date of Patent: Dec. 8, 2020

(54) METHOD OF EVALUATING IMPURITY GETTERING CAPABILITY OF EPITAXIAL SILICON WAFER AND EPITAXIAL SILICON WAFER

(71) Applicant: SUMCO CORPORATION, Tokyo (JP)

(72) Inventors: Satoshi Shigematsu, Tokyo (JP); Ryosuke Okuyama, Tokyo (JP); Kazunari Kurita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/488,758

(22) PCT Filed: Jan. 12, 2018

(86) PCT No.: PCT/JP2018/001471
§ 371 (c)(1),
(2) Date: Aug. 26, 2019

(87) PCT Pub. No.: WO2018/159140
PCT Pub. Date: Sep. 7, 2018

(65) Prior Publication Data
US 2020/0203178 A1  Jun. 25, 2020

(30) Foreign Application Priority Data

Feb. 28, 2017 (JP) .................. 2017-037606
Aug. 8, 2017 (JP) .................. 2017-153209

(51) Int. Cl.
*H01L 21/322* (2006.01)
*H01L 21/265* (2006.01)

(52) U.S. Cl.
CPC .... *H01L 21/3225* (2013.01); *H01L 21/26506* (2013.01); *H01L 21/26566* (2013.01)

(58) Field of Classification Search
CPC .......... H01L 21/3225; H01L 21/26506; H01L 21/26566
(Continued)

(56) References Cited

U.S. PATENT DOCUMENTS

2016/0351393 A1* 12/2016 Iwanaga ........... H01L 21/26506

FOREIGN PATENT DOCUMENTS

| JP | 6-338507 | 12/1994 |
| JP | 2006-29786 | 2/2006 |

(Continued)

OTHER PUBLICATIONS

International Search Report issued in International Patent Application No. PCT/JP2018/001471, dated Mar. 27, 2018.
(Continued)

*Primary Examiner* — Tong-Ho Kim
(74) *Attorney, Agent, or Firm* — Greenblum & Bernstein, P.L.C.

(57) ABSTRACT

Provided is a method of evaluating the impurity gettering capability of an epitaxial silicon wafer, which allows for very precise evaluation of the impurity gettering behavior of a modified layer formed immediately under an epitaxial layer, the modified layer containing carbon in solid solution. In this method, a modified layer located immediately under an epitaxial layer, the modified layer containing carbon in solid solution, is analyzed by three-dimensional atom probe microscopy, and the impurity gettering capability of the modified layer is evaluated based on a three-dimensional map of carbon in the modified layer, obtained by the analysis.

11 Claims, 11 Drawing Sheets
(2 of 11 Drawing Sheet(s) Filed in Color)

(58) Field of Classification Search
USPC .......................................................... 257/678
See application file for complete search history.

(56) References Cited

FOREIGN PATENT DOCUMENTS

| JP | 2012-159415 | 8/2012 |
|----|-------------|--------|
| JP | 2014-99478  | 5/2014 |
| JP | 2015-130397 | 7/2015 |
| WO | 2012/157162 | 11/2012 |
| WO | 2015/104965 | 7/2015 |

OTHER PUBLICATIONS

International Preliminary Report on Patentability (IPRP) for International Patent Application No. PCT/JP2018/001471, dated Sep. 3, 2019; including Written Opinion and English-language translation thereof.

* cited by examiner

FIG. 2A
FIG. 2B
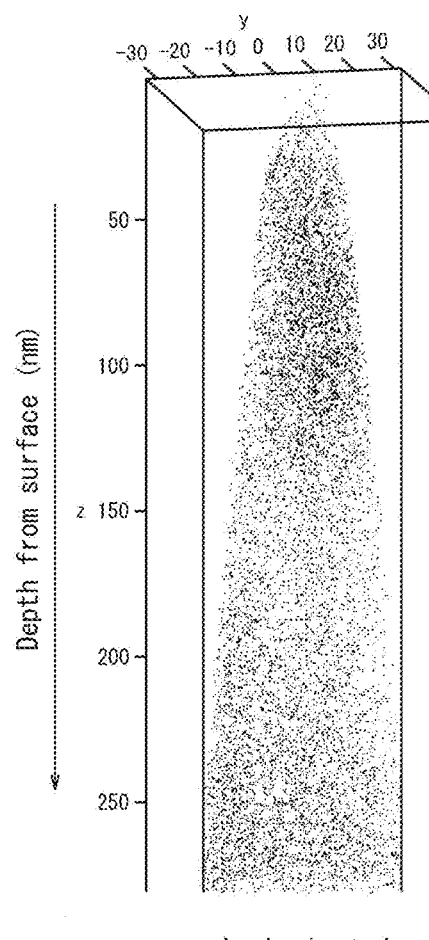
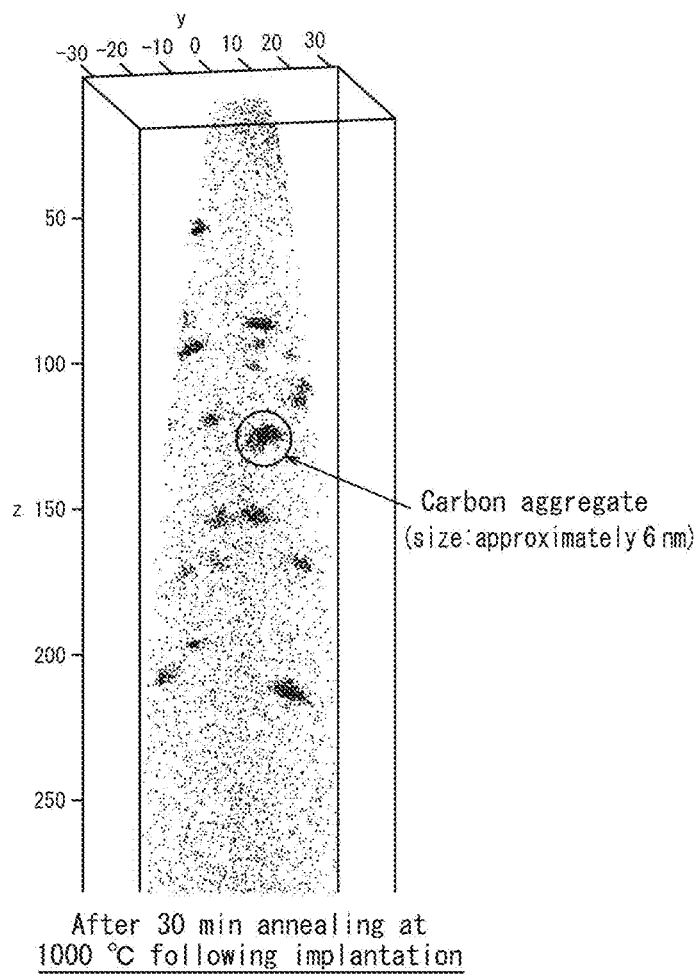

METHOD OF EVALUATING IMPURITY GETTERING CAPABILITY OF EPITAXIAL SILICON WAFER AND EPITAXIAL SILICON WAFER

TECHNICAL FIELD

This disclosure relates to a method of evaluating the impurity gettering capability of an epitaxial silicon wafer and an epitaxial silicon wafer.

BACKGROUND

Epitaxial silicon wafers in which a single crystal silicon epitaxial layer is formed on a silicon wafer have been developed from various viewpoints to be used as material wafers for fabricating various kinds of semiconductor devices such as solid-state imaging devices. For example, when an epitaxial layer is contaminated with a heavy metal, dark current increases in a solid-state imaging device, which results in the formation of defects called white spot defects.

Considering the above, in order to prevent such heavy metal contamination, techniques for previously forming a gettering site for trapping a heavy metal immediately under an epitaxial layer of an epitaxial silicon wafer are being developed. One of the techniques is a known technique of forming a gettering site in a silicon wafer by ion implantation.

For example, JP H06-338507 A (PTL 1) discloses a method of manufacturing a silicon epitaxial wafer by implanting carbon ions through a surface of the silicon wafer to form a carbon ion implanted region, and then forming a silicon epitaxial layer on the surface.

Further, WO 2012/157162 A (PTL 2) describes a method of producing an epitaxial silicon wafer, including a first step of irradiating a surface of a silicon wafer with cluster ions containing carbon to form a modified layer containing carbon in solid solution in a surface portion of the silicon wafer and a second step of forming an epitaxial layer on the modified layer of the silicon wafer.

Still further, WO 2015/104965 A (PTL 3) describes an improved technique of the technique described in PTL 2, in which irradiation with cluster ions is performed so that part of the modified layer in the thickness direction forms an amorphous layer, thereby improving the gettering capability for heavy metals.

CITATION LIST

Patent Literature

PTL 1: JP H06-338507 A
PTL 2: WO 2012/157162 A
PTL 3: WO 2015/104965 A

SUMMARY

Technical Problem

In the techniques of forming an epitaxial layer after implanting carbon ions into a silicon wafer as in PTLs 1 to 3, the region implanted with carbon ions is considered to serve as a gettering site. However, the gettering behavior of the carbon ion implanted region has not been sufficiently elucidated.

PTL 1 describes that ion-implanted carbon accelerates the precipitation of oxygen to form dense crystal defects, and the crystal defects form a gettering site and that the difference between the covalent radii of Si and carbon causes film stress and the stress itself also forms the gettering site. However, the carbon ion implanted region has not been analyzed in any way, and the mechanism of gettering remains in the realm of speculation.

PTL 2 describes that secondary ion mass spectroscopy (SIMS) performed in the depth direction of an epitaxial silicon wafer revealed that the peak of the carbon concentration profile lies in the modified layer. Further, PTL 2 describes that SIMS measurements performed after performing a forced contamination test using nickel and copper revealed that the peaks of the concentration profiles of nickel and copper lies at the position of the peak of the carbon concentration profile. However, this result only suggests that nickel and copper are gettered in the carbon ion implanted region (modified layer), and does not demonstrate the detailed gettering behavior of the modified layer for heavy metals.

PTL 3 demonstrates that part of the modified layer in the thickness direction forms an amorphous layer by observing a cross section of the modified layer using a transmission electron microscope (TEM). Further, the TEM observation reveals that the amorphous layer disappears after the formation of an epitaxial layer during which the crystallinity of the amorphous layer is recovered by heat treatment, and black spot defects are formed instead in the modified layer. However, this document only confirms that the gettering capability is high in such a case, and does not yet elucidate the detailed gettering behavior of the modified layer for heavy metals.

As suggested above, in terms of guiding design principles for ion irradiation and heat treatment conditions for the future, it is important to clarify the impurity gettering behavior of a modified layer which cannot be elucidated by methods that have been used to analyze an ion implanted region immediately under an epitaxial layer, such as SIMS or TEM thereby evaluating the impurity gettering capability of an epitaxial silicon wafer.

It could therefore be helpful to provide a method of evaluating the impurity gettering capability of an epitaxial silicon wafer, which allows for very precise evaluation of the impurity gettering behavior of a modified layer formed immediately under an epitaxial layer, the modified layer containing carbon in solid solution, and to provide an epitaxial silicon wafer excellent in gettering capability evaluated by the evaluation method.

Solution to Problem

In order to address the above challenges, we contemplated applying three-dimensional atom probe (3DAP) microscopy to the analysis of a modified layer formed immediately under an epitaxial layer. 3DAP microscopy makes it possible to achieve a higher resolution than that achieved by SIMS, and to perform three-dimensional mapping/analysis in addition to the observation of a cross section of a surface which is performed by TEM. Accordingly, we contemplated analyzing the modified layer by 3DAP microscopy to obtain a three-dimensional map with respect to carbon or a three-dimensional map with respect to an impurity of interest.

We thus found the following. First, immediately after the formation of a modified layer by carbon ion implantation, even if the implanted ions are cluster ions, carbon atoms are uniformly distributed in the modified layer. When heat treatment is performed after the ion implantation, carbon atoms are found to be aggregated to form aggregates particularly in a region of 200 nm from the surface layer of the modified layer. Impurities to be gettered are found to segregate in and around the carbon aggregates in the modified layer. Thus, we found that the impurity gettering behavior of the modified layer can be evaluated with high precision by analyzing the modified layer using 3DAP microscopy. This led to the completion of this disclosure.

This disclosure completed based on the above findings primarily includes the following features.

(1) A method of evaluating an impurity gettering capability of an epitaxial silicon wafer produced through:

a first step of implanting ions containing carbon through a surface of a silicon wafer to form a modified layer in a surface portion of the silicon wafer, the modified layer containing carbon in solid solution, and a second step of forming an epitaxial layer on the modified layer of the silicon wafer, the method comprising:

subjecting the silicon wafer to a heat treatment after the first step, then analyzing the modified layer of the silicon wafer by a three-dimensional atom probe microscopy to obtain a three-dimensional map of carbon in the modified layer, and evaluating an impurity gettering capability of the modified layer based on the three-dimensional map of carbon.

(2) The method of evaluating an impurity gettering capability of an epitaxial silicon wafer, according to (1) above, the method comprising:

identifying carbon aggregates in a region ranging from a surface of the modified layer to a depth of 200 nm on the three-dimensional map of carbon, obtaining concentration profiles of carbon and an impurity in and around the carbon aggregates, and evaluating the impurity gettering capability of the modified layer based on the concentration profiles.

(3) The method of evaluating an impurity gettering capability of an epitaxial silicon wafer, according to (1) above, the method comprising:

identifying carbon aggregates in a region ranging from a surface of the modified layer to a depth of 200 nm on the three-dimensional map of carbon, and evaluating the impurity gettering capability of the modified layer based on a density of the carbon aggregates.

(4) The method of evaluating an impurity gettering capability of an epitaxial silicon wafer, according to (1) above, the method comprising:

creating first isosbestic surfaces having a predetermined value of carbon concentration in a region ranging from a surface of the modified layer to a depth of 200 nm on the three-dimensional map of carbon, creating second isosbestic surfaces having a predetermined value of an impurity concentration on the three-dimensional map, and evaluating the impurity gettering capability of the modified layer based on a positional relationship between the first isosbestic surfaces and the second isosbestic surfaces.

(5) The method of evaluating an impurity gettering capability of an epitaxial silicon wafer, according to (1) above, the method comprising:

creating first isosbestic surfaces having a predetermined value of carbon concentration in a region ranging from a surface of the modified layer to a depth of 200 nm on the three-dimensional map of carbon, creating a proxy gram of carbon and an impurity using at least one of the first isosbestic surfaces as a reference plane, and evaluating the impurity gettering capability of the modified layer based on the proxy gram.

(6) The method of evaluating an impurity gettering capability of an epitaxial silicon wafer, according to (1) above, the method comprising:

creating first isosbestic surfaces having a predetermined value of carbon concentration in a region ranging from a surface of the modified layer to a depth of 200 nm on the three-dimensional map of carbon, and evaluating the impurity gettering capability of the modified layer based on a density of spheroids formed by the first isosbestic surfaces.

(7) The method of evaluating an impurity gettering capability of an epitaxial silicon wafer, according to any one of (1) to (6) above, wherein the impurity is a heavy metal element.

(8) The method of evaluating an impurity gettering capability of an epitaxial silicon wafer, according to any one of (1) to (7) above, wherein the heat treatment is performed under conditions of 900° C. or more and 1300 or less in a non-oxidizing atmosphere.

(9) The method of evaluating an impurity gettering capability of an epitaxial silicon wafer, according to any one of (1) to (8) above, wherein the heat treatment is a heat treatment performed for the epitaxial growth in the second step.

(10) The method of evaluating an impurity gettering capability of an epitaxial silicon wafer, according to any one of (1) to (9) above, wherein the ions containing carbon are cluster ions containing carbon and hydrogen.

(11) An epitaxial silicon wafer comprising:

a silicon wafer;

a modified layer located in a surface portion of the silicon wafer, the modified layer containing carbon in solid solution within the silicon wafer; and an epitaxial layer located on the modified layer, wherein in a three-dimensional map of carbon obtained by analyzing the modified layer by a three-dimensional atom probe microscopy, carbon aggregates are present in a region ranging from a surface of the modified layer to a depth of 200 nm, a mean diameter of the carbon aggregates is 5 nm or more, and a density of the carbon aggregates is $1 \times 10^{15}/cm^3$ or more.

Advantageous Effect

According to the disclosed method of evaluating the impurity gettering capability of an epitaxial silicon wafer, the impurity gettering behavior of a modified layer formed immediately under an epitaxial layer, the modified layer containing carbon in solid solution, can be evaluated with high precision. Further, the disclosed epitaxial silicon wafer is excellent in gettering capability evaluated by the evaluation method.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings:

FIG. 2A is a three-dimensional map obtained by 3DAP microscopy on a surface portion of a silicon wafer immediately after $C_3H_5$ cluster ions are implanted in Experimental Example 1; and FIG. 2B is a three-dimensional map obtained by 3DAP microscopy on the surface portion of the silicon wafer after heat treatment performed at 1100° C. for 30 min following the implantation of $C_3H_5$ cluster ions in Experimental Example 1;

FIGS. 7A to 7C are three-dimensional maps obtained by 3DAP microscopy in Experimental Example 3, in which FIG. 7A is an atom map of C, FIG. 7B is an atom map of Cu, and FIG. 7C is an atom map of C and Cu;

DETAILED DESCRIPTION

Figure 1:
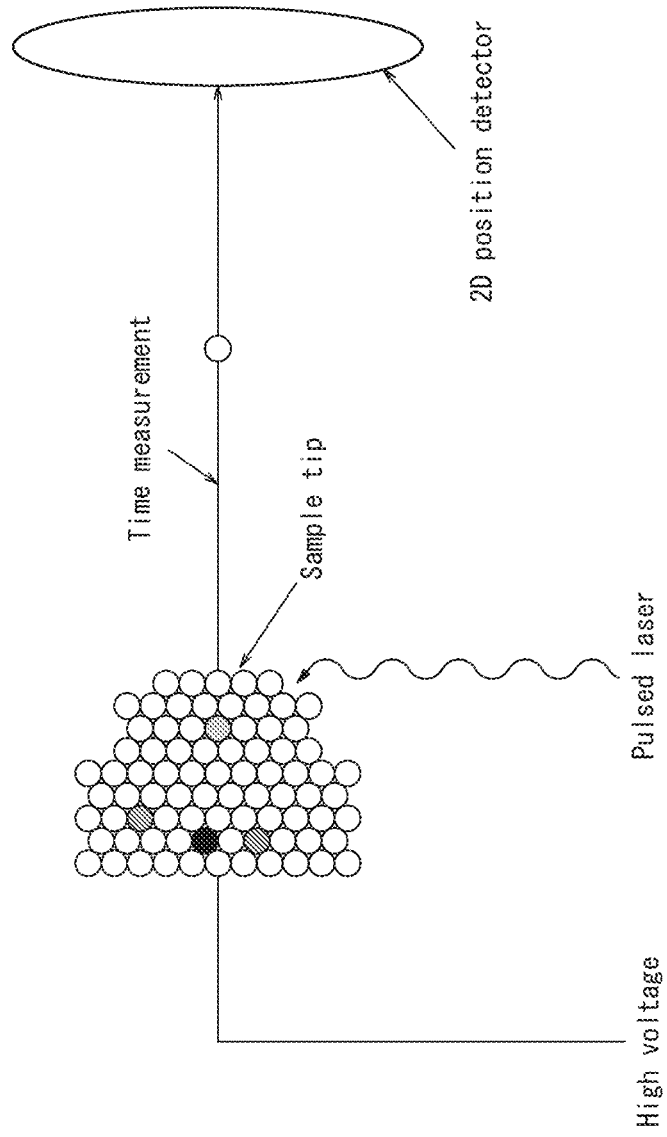
FIG. 1 is a schematic view illustrating the measuring principle of three-dimensional atom probe (3DAP) microscopy.

Method of Evaluating Impurity Gettering Capability of Epitaxial Silicon Wafer

One embodiment of this disclosure is a method of evaluating the impurity gettering capability of an epitaxial silicon wafer produced through a first step of implanting ions containing carbon through a surface of a silicon wafer to form a modified layer containing carbon in solid solution in a surface portion of the silicon wafer, and a second step of forming an epitaxial layer on the modified layer of the silicon wafer.

Examples of the silicon wafer include a bulk single crystal silicon wafer which does not have an epitaxial layer on its surface. Further, carbon and/or nitrogen may be added to the silicon wafer to achieve a higher Bettering capability. Moreover, a given dopant may be added to the silicon wafer at a predetermined concentration to obtain an n+type, p+ type, n− type, or p− type substrate.

Alternatively, an epitaxial silicon wafer in which a silicon epitaxial layer is formed on a surface of a bulk single crystal silicon wafer may be used as the silicon wafer. The silicon epitaxial layer can be formed by CVD under typical conditions. The thickness of the epitaxial layer is preferably in the range of 0.1 μm to 10 μm, more preferably in the range of 0.2 μm to 5 μm, Examples of the ions containing carbon include carbon monomer ions (simile ions). The acceleration voltage for monomer ions is 150 keV/atom to 2000 keV/atom and can be appropriately set in the range. Further, the dose of monomer ions may be, for example, but not limited to $1\times10^{13}$ atoms/cm$^2$ to $1\times10^{16}$ atoms/cm$^2$.

Preferred examples of the ions containing carbon include cluster ions containing carbon. The term "cluster ion" herein refers to a plurality of atoms or molecules that are aggregated into a cluster to which a positive charge or a negative charge is imparted to form an ion. The cluster is a bulk aggregate of a plurality of (typically around 2 to 2000) atoms or molecules that are bound to one another.

In a situation in which a silicon wafer is irradiated with cluster ions formed, for example, from carbon and hydrogen, upon irradiation of the silicon wafer with the cluster ions, the energy of the cluster ions causes the silicon wafer to momentarily reach a high temperature state of approximately 1350° C. to 1400° C. and melts the silicon. After that, the silicon is rapidly cooled such that the carbon and hydrogen dissolve in solid solution in a surface portion of the silicon wafer. Correspondingly, the "modified layer" herein means a layer in which the constituent elements of the ions used for irradiation form solid solution at interstitial positions or substitution positions in the crystal lattice of the surface portion of the silicon wafer. Although depending on the acceleration voltage and cluster size of the cluster ions, the concentration profile of carbon in the depth direction of the silicon wafer measured by SIMS is sharper than in the case of monomer ions and the thickness of a region in which carbon used for irradiation is localized (i.e., the modified layer) is roughly 500 nm or less (for example, approximately 50 nm to 400 nm). The modified layer serves as a gettering site. This is also described in PTLs 2 and 3.

The cluster irradiation conditions include the constituent elements of cluster ions, the dose of cluster ions, the cluster size, the acceleration voltage for cluster ions, and the beam current.

In this embodiment, the constituent elements of cluster ions include carbon, and preferably include carbon and hydrogen. For example, when cyclohexane ($C_6H_{12}$) is used as a source gas, cluster ions formed from carbon and hydrogen can be produced. Further, $C_nH_m$ ($3 \leq n \leq 16$, $3 \leq m \leq 10$) clusters produced from pyrene ($C_{16}H_{10}$), dibenzyl ($C_{14}H_{14}$), or the like is preferably used in particular as a carbon source compound. This is because a beam of small cluster ions can be easily controlled.

The cluster size can be appropriately set to 2 to 100, preferably 60 or less, and more preferably 50 or less. "Cluster size" herein means the number of atoms or molecules forming one cluster. In the experimental examples described below, $C_3H_5$ having a cluster size of 8 was used. The cluster size can be adjusted for example by controlling the pressure of gas sprayed from a nozzle, the pressure in a vacuum vessel, and the voltage applied to a filament during ionization. The cluster size can be determined by finding the cluster number distribution by mass spectrometry using a high frequency quadrupole field or by time-of-flight mass spectrometry and calculating the average of the cluster numbers.

The dose of cluster ions can be adjusted by controlling the ion irradiation time. The carbon dose may be, but not limited to, around $1\times10^{14}$ atoms/cm$^2$ or more and $1\times10^{16}$ atoms/cm$^2$ or less.

When $C_nH_m$ ($3 \leq n \leq 16$, $3 \leq m \leq 10$) is used as the cluster ions, the acceleration voltage for the cluster ions may be more than 0 keV/atom and 50 keV/atom or less, preferably 40 keV/atom or less per one carbon atom.

The beam current may be around 0.3 mA or more and 3.0 mA or less.

The silicon epitaxial layer to be formed on the modified layer can be formed under typical conditions. First, a silicon wafer is loaded into an epitaxial growth apparatus and hydrogen bake is performed. The conditions for hydrogen bake are as follows: the epitaxial growth apparatus has a hydrogen atmosphere inside; a silicon wafer is placed in the furnace at a furnace temperature of 600° C. or more and 900° C. or less and heated to a temperature of 1100° C. or more to 1200° C. or less at a heating rate of 1° C./s or higher to 15° C./s or lower; and the temperature is maintained for 30 s or more and 1 min or less. This hydrogen bake is performed to remove a natural oxide layer formed on the wafer surface before an epitaxial layer is grown. Subsequently, a source gas such as dichlorosilane or trichlorosilane can be introduced into a chamber using hydrogen as a carrier gas, so that a single crystal silicon can be epitaxially grown on the silicon wafer by CVD at a temperature in the range of approximately 1000° C. to 1200° C., although the growth temperature depends also on the source gas to be used. The thickness of the epitaxial layer may be, but not limited to, approximately 1 μm to 15 μm.

In this embodiment, a silicon wafer is subjected to heat treatment after ion implantation (after the first step), and a modified layer of the silicon wafer is then analyzed by 3DAP microscopy, and the impurity gettering capability of the modified layer is evaluated based on a three-dimensional map of carbon in the modified layer, obtained by the analysis. The measuring principle of 3DAP microscopy and experimental examples that led to the completion of this disclosure will be described below.

3DAP Microscopy

A measurement protocol and the measuring principle of 3DAP microscopy are described with reference to FIG. 1. First, a measurement object is processed using a focused ion beam to prepare a sharp needle shaped sample having a diameter of approximately 100 nm at most. This sample is placed in a 3DAP microscope, evacuation and cooling are performed, and a high voltage of approximately 1.5 kV to 5 kV is applied to the sample. In this state, the sample is further irradiated with pulsed laser at an energy of approximately 20 pJ/pulse, thus a high electric field is formed at the tip of the sample, which results in the field evaporation phenomenon (neutral atoms on the sample surface are positively ionized and desorbed from the surface). Field evaporated ions are detected by a two-dimensional position sensor, thus, two-dimensional coordinates (x,y) of each atom are determined. Further, the time of flight in which ions irradiated by pulsed laser reach a sensor is measured by a time-of-flight (TOF) analyzer, and thus the ion species are also identified. A similar measurement in the depth direction of the sample can be performed by repeating laser irradiation, thus the depth coordinate (z) of each atom can be determined. The thus obtained data are processed to create a three-dimensional atom map. The field evaporation may be caused by applying pulse voltage instead of pulsed laser.

Experimental Example 1

An n-type silicon wafer (diameter: 300 mm, thickness: 725 mm, dopant: phosphorus, dopant concentration: $5.0 \times 10^{14}$ atoms/cm$^3$) obtained from a CZ single crystal silicon ingot was prepared. Next, a cluster ion generating apparatus (CLARIS produced by Nissin Ion Equipment Co., Ltd.; CLARIS is a registered trademark in Japan, other countries, or both) was used to generate $C_3H_5$ clusters and irradiate the surface of the silicon wafer therewith at a carbon dose of $1.0 \times 10^{15}$ atoms/cm$^2$, thereby forming a modified layer. The acceleration voltage per cluster was 80 keV/Cluster, the beam current was 800 μA, the tilt angle was 0°, and the twist angle was 0°.

The thus obtained silicon wafer was processed by a focused ion beam to prepare a sharp needle shaped sample having a trunk diameter of approximately 70 nm and a tip diameter of approximately 20 nm. The tip of the needle shaped sample is a surface of a modified layer of the silicon wafer, and the longitudinal direction of the needle shaped sample was made to agree with the depth direction from the modified layer surface of the silicon wafer. This sample was placed in a 3DAP apparatus (LEAP 4000X Si manufactured by AMETEK Inc.) to perform measurements by 3DAP microscopy to obtain a three-dimensional carbon map. The three-dimensional map is presented in FIG. 2A.

Next, a silicon wafer obtained in the same manner as the above was subjected to heat treatment at 1100° C. for 30 min in a nitrogen atmosphere. After that, the modified layer was analyzed in the same manner as the above by 3DAP microscopy to obtain a three-dimensional map of carbon. The three-dimensional map is presented in FIG. 2B.

As is evident from FIG. 2A, immediately after the formation of a modified layer by carbon ion implantation, although the implanted ions were cluster ions, carbon atoms were uniformly distributed in the modified layer. However, as evident from FIG. 2B, carbon atoms were found to be aggregated by performing heat treatment after the ion implantation to form aggregates particularly in a region of approximately 200 nm from the surface of the modified layer.

Figure 3:
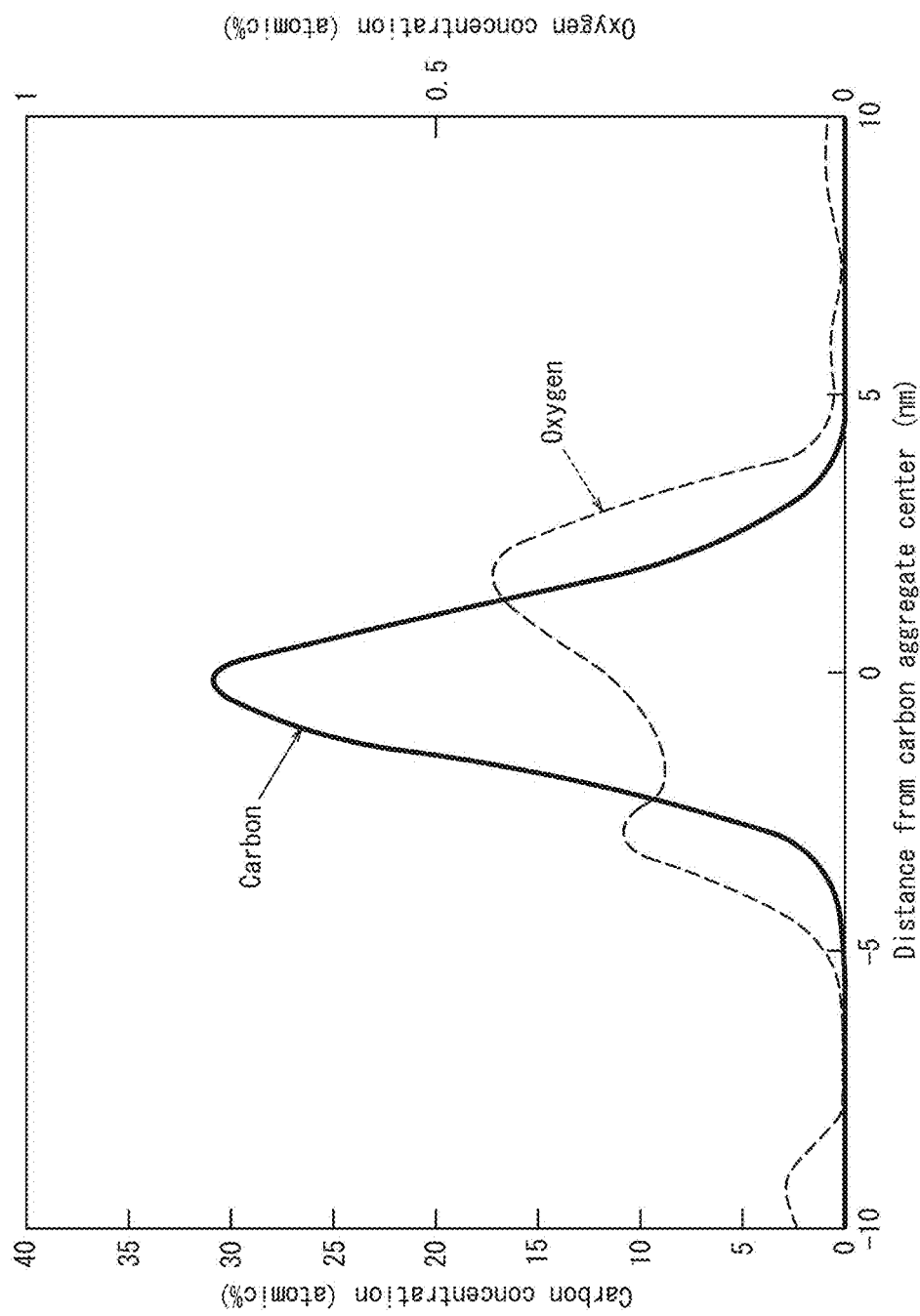
FIG. 3 illustrates the concentration profiles of carbon and oxygen in the radial direction from the center of a carbon aggregate of interest circled in the three-dimensional map in FIG. 2B.

Next, the concentration profiles of carbon and oxygen in the radial direction from the center of a given carbon aggregate of interest in the carbon map of FIG. 2B were determined. In FIG. 2B, the given carbon aggregate of interest is circled. The concentration profiles of carbon and oxygen in the radial direction from the center of the carbon aggregate are illustrated in FIG. 3. Thus, this experimental example demonstrated that oxygen in the silicon wafer had been segregated in and around the carbon aggregates in the modified layer. This finding could not have been obtained by conventional techniques such as SIMS and TEM.

In the carbon map of FIG. 2B, carbon aggregates in a region ranging from the surface of the modified layer to a depth of 200 nm were identified, and the diameter of each carbon aggregate was determined. The definition of a carbon aggregate employed in this experimental example is described with reference to FIG. 4. In this experimental example, a carbon aggregate was defined by determining two parameters of dmax and Nmin. A carbon atom A in the three-dimensional map was focused and carbon atoms B, C, D, . . . in a region within a distance of dmax from the carbon atom A (in a spherical area) were taken as potential aggregate constituents. Next, carbon atoms present in a region within a distance of dmax from these carbon atoms B, C, D, . . . are taken as potential aggregate constituents. This operation is repeated until there is no potential aggregate constituent. When Nmin or more carbon atoms are potential aggregate constituents, the carbon atoms that are the potential aggregate constituents and atoms other than carbon present in the region within a distance of dmax from these carbon atoms (silicon, oxygen, etc.) are collectively referred to as a carbon aggregate. In this experimental example, dmax=1 nm and Nmin=30.

Note that this disclosure is not limited to dmax=1 nm and Nmin=30; dmax can be selected from the range of 0.5 nm to 5 nm, and Nmin can be selected from the range of 10 to 100.

Figure 4:
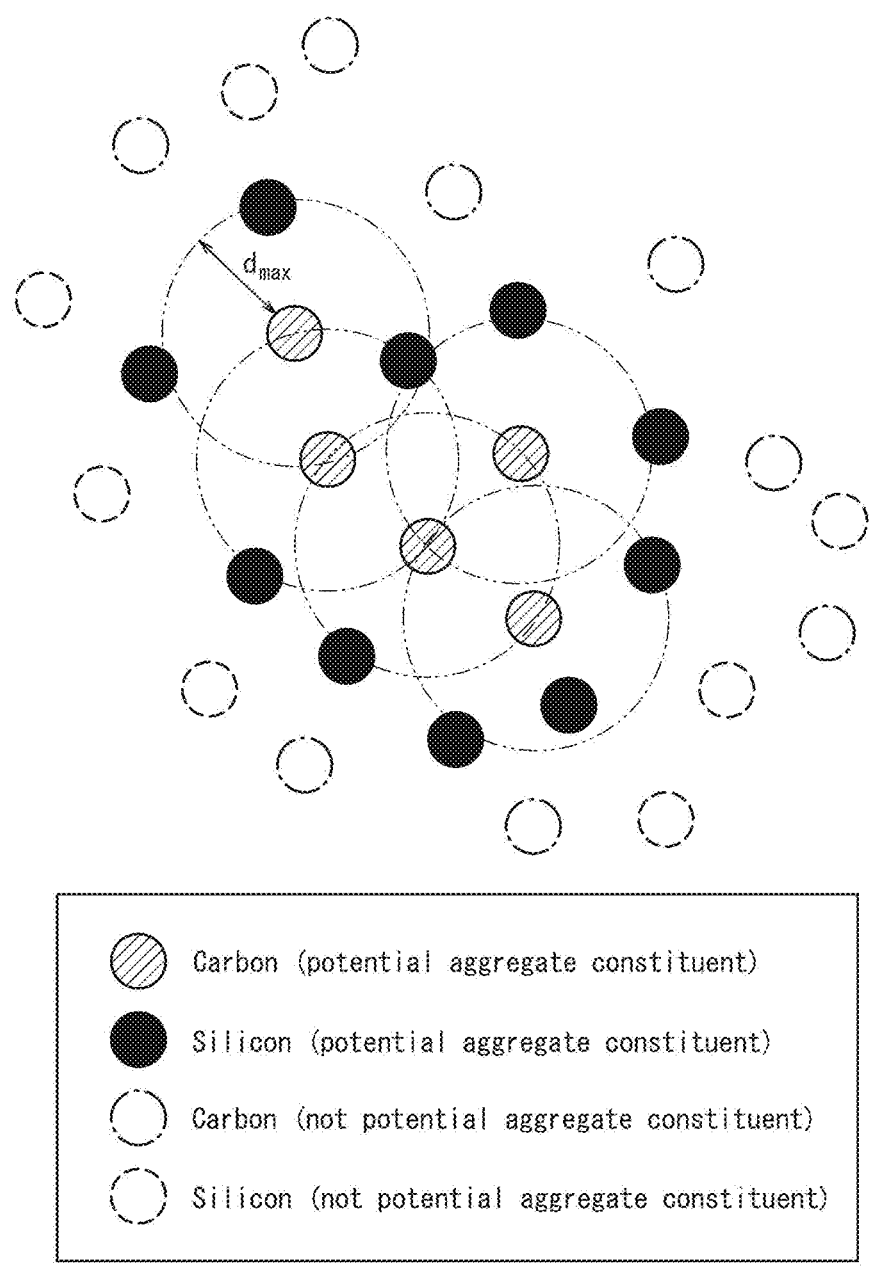
FIG. 4 is a schematic view for describing the definition of a carbon aggregate in one embodiment of this disclosure.

As illustrated in FIG. 4, a carbon aggregate also includes atoms other than carbon, such as silicon included in the region within dmax from the carbon atoms that are the potential aggregate constituents. The spherical equivalent volume diameter of the thus defined carbon aggregate is determined from its volume as the diameter of the carbon aggregate.

In the carbon map of FIG. 2B, the mean diameter of the carbon aggregates in the region ranging from the surface of the modified layer to a depth of 200 nm was 6.3 nm, and the density of the carbon aggregates was $6.0 \times 10^{16}/cm^3$. The gettering behavior of the modified layer was found to be the segregation of impurities in and around the carbon aggregates; accordingly, the gettering capability to be achieved can conceivably be evaluated by evaluating the mean diameter and the density of the carbon aggregates based on the carbon map. When the density of carbon aggregates is higher, a higher gettering capability is considered to be achieved.

Experimental Example 2

Cluster ion irradiation and heat treatment were performed under the same conditions by the same method as in Experimental example 1 except that the carbon dose was varied in the range of $1.0 \times 10^{14}$ atoms/cm² to $1.0 \times 10^{16}$ atoms/cm². The modified layer was analyzed by 3DAP microscopy to obtain three-dimensional carbon maps.

Figure 5:
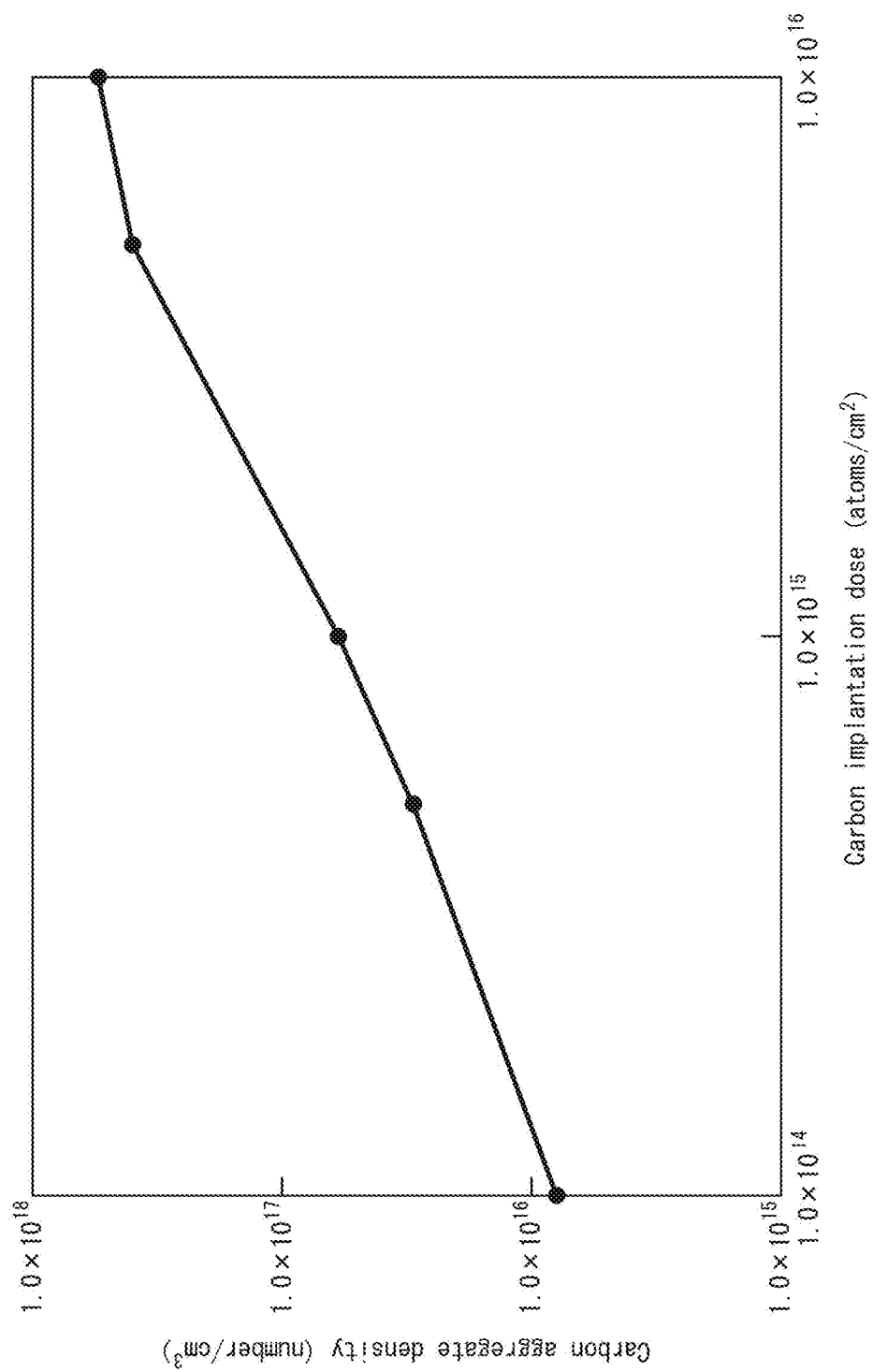
FIG. 5 is a graph illustrating the relationship between the carbon implantation dose and the carbon aggregate density in Experimental Example 2.

The density of carbon aggregates in a region ranging from the surface of the modified layer to a depth of 200 nm was determined from each three-dimensional map. FIG. 5 illustrates the relationship between the carbon implantation dose and the carbon aggregate density. As is apparent from FIG. 5, a positive correlation was found between the carbon implantation dose and the carbon aggregate density. A higher carbon implantation dose results in a higher gettering capability, as is also known from the description of PTL 3. This demonstrates that the gettering capability for impurities can be evaluated based on the carbon aggregate density determined from a three-dimensional carbon map as in this embodiment.

Experimental Example 3

Next, an experimental example is described in which after a modified layer was formed on a silicon wafer, an epitaxial layer was actually formed, and the gettering capability was evaluated not only for oxygen but also for copper, which is a heavy metal, as impurities.

An n-type silicon wafer (diameter: 300 mm, thickness: 725 µm dopant: phosphorus, dopant concentration: $5.0 \times 10^{14}$ atoms/cm³) obtained from a CZ single crystal silicon ingot was prepared. Next, a cluster ion generating apparatus (CLARIS produced by Nissin Ion Equipment Co., Ltd.) was used to generate $C_3H_5$ clusters and irradiate the surface of the silicon wafer therewith at a carbon dose of $5.0 \times 10^{15}$ atoms/cm², thereby forming a modified layer. The acceleration voltage per cluster was 80 keV/Cluster, the beam current was 800 µA, the tilt angle was 0°, and the twist angle was 0°.

After that, the silicon wafer was transferred into a single wafer processing epitaxial growth apparatus (manufactured by Applied Materials, Inc.) and subjected to hydrogen bake at 1120° C. for 30 s in the apparatus. A silicon epitaxial layer (thickness: 0.5 µm, dopant: phosphorus, dopant concentration: $1.0 \times 10^{15}$ atoms/cm³) was then epitaxially grown on the modified layer on the silicon wafer by CVD at 1150° C. using hydrogen as a carrier gas and trichlorosilane as a source gas, thereby obtaining a silicon epitaxial wafer.

Subsequently, Cu ions were implanted at a dose of $1 \times 10^{15}$ atoms/cm² into the epitaxial layer of the silicon epitaxial wafer to evaluate the gettering capability for Cu. After that, in order to diffuse the implanted Cu, heat treatment was performed on the epitaxial silicon wafer at 1000° C. for 1 hour.

The thus obtained epitaxial silicon wafer sample was subjected to measurements and evaluation by SIMS, TEM, and 3DAP microscopy as described below. The methods and results of the measurements and evaluation are described below.

<SIMS>

Figure 6:
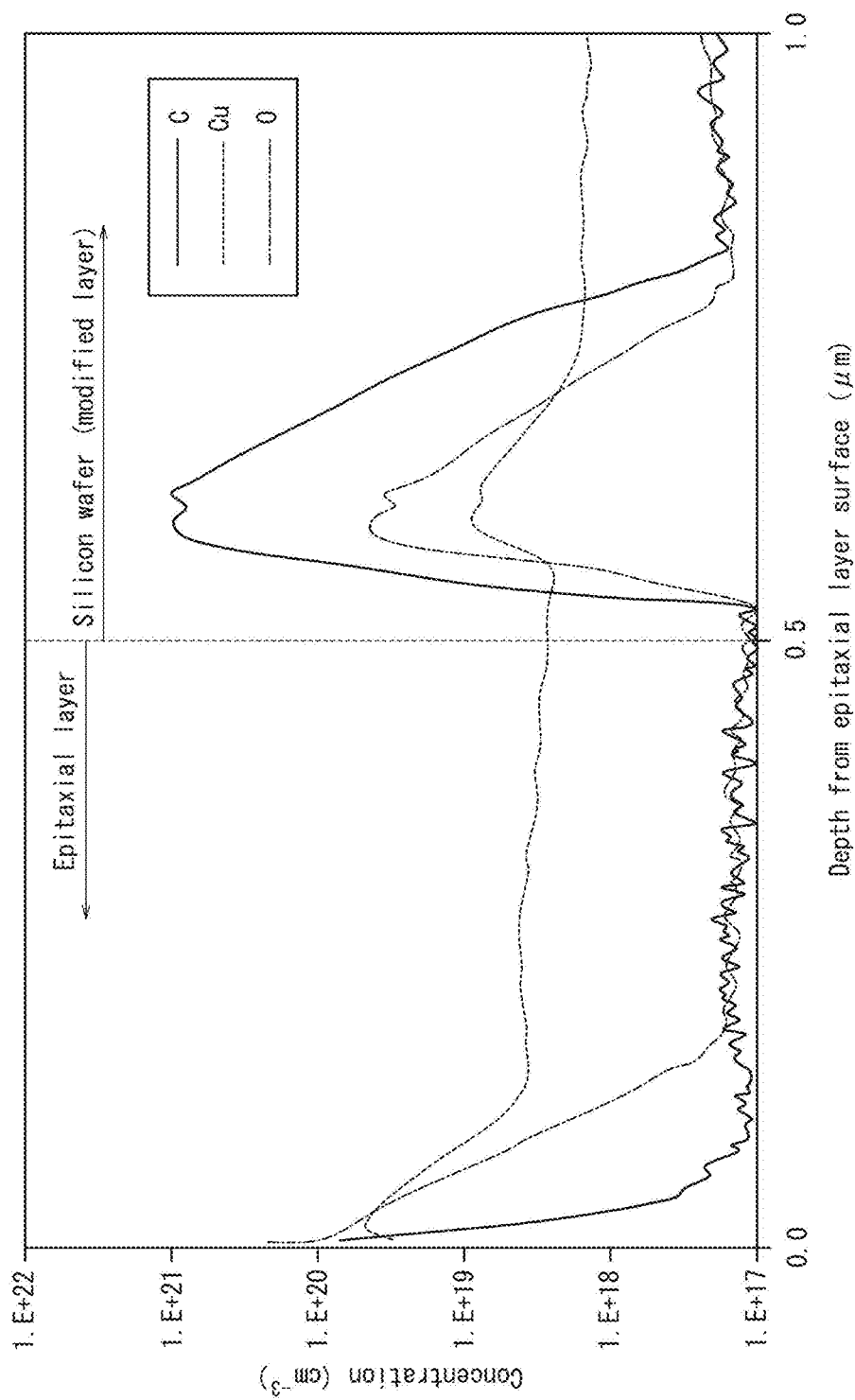
FIG. 6 illustrates the concentration profiles of C, O, and Cu in the depth direction from the surface of an epitaxial layer, obtained by SIMS measurements in Experimental Example 3.

The concentration profiles of C, O, and Cu in the depth direction from the epitaxial layer surface that were obtained by SIMS measurements are given in FIG. 6. As is apparent from FIG. 6, a sharp C peak was observed immediately under the epitaxial layer, thus the modified layer was identified. Further, the peaks of O and Cu were also observed at the same position as the peak of C. This confirmed that O in the silicon wafer and deliberately implanted Cu were gettered (trapped) in the modified layer containing C in solid solution. This result agrees with the disclosure of PTL 2.

<TEM>

When a cross section of the modified layer of the epitaxial silicon wafer was observed by TEM, black point defects probably having been caused by the implantation of $C_3H_5$ cluster ions were observed. This agrees with the disclosure of PTL 3.

<3DAP Microscopy>

With a view to evaluating the gettering behavior in more detail than SIMS and TEM, 3DAP microscopy was performed. Specifically, an epitaxial silicon wafer prepared was processed by a focused ion beam to remove the epitaxial layer and was then processed by a focused ion beam to prepare a sharp needle shaped sample having a trunk diameter of approximately 70 nm and a tip diameter of approximately 20 nm. The tip of the needle shaped sample is a surface of a modified layer of the silicon wafer (i.e., the interface between the silicon wafer and the epitaxial layer), and the longitudinal direction of the needle shaped sample was made to agree with the depth direction from the modified layer surface of the silicon wafer (the surface of the silicon wafer). This sample was placed in a 3DAP apparatus (LEAP 4000X Si manufactured by AMETEK Inc.) to perform measurements by 3DAP microscopy to obtain three-dimensional maps of carbon, copper, and oxygen.

Figure 7:
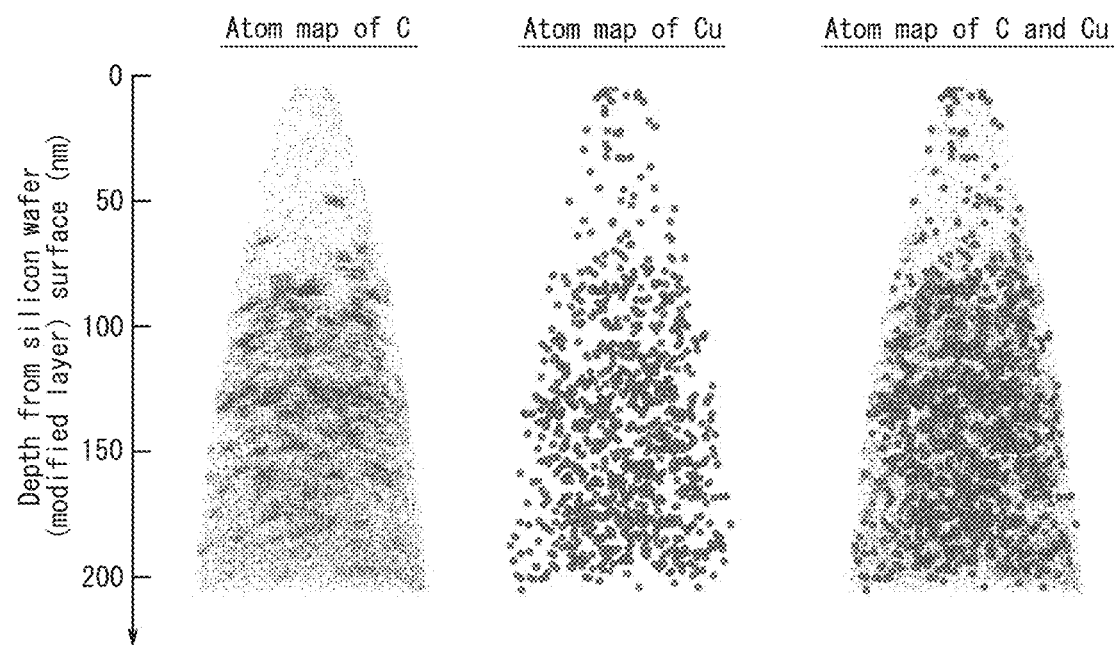

FIG. 7A presents an atom map of C, FIG. 7B presents an atom map of Cu, and FIG. 7C presents an atom map of C and Cu. As is apparent from FIG. 7A, in the modified layer having been subjected to heat treatment in the formation of the epitaxial layer, carbon aggregates were observed particularly in a region from the surface to a depth of approximately 50 nm to 200 nm. Further, as is apparent from FIGS. 7B and 7C, Cu, which is a heavy metal impurity, was found to be mostly present at the positions of the carbon aggregates.

Figure 8:
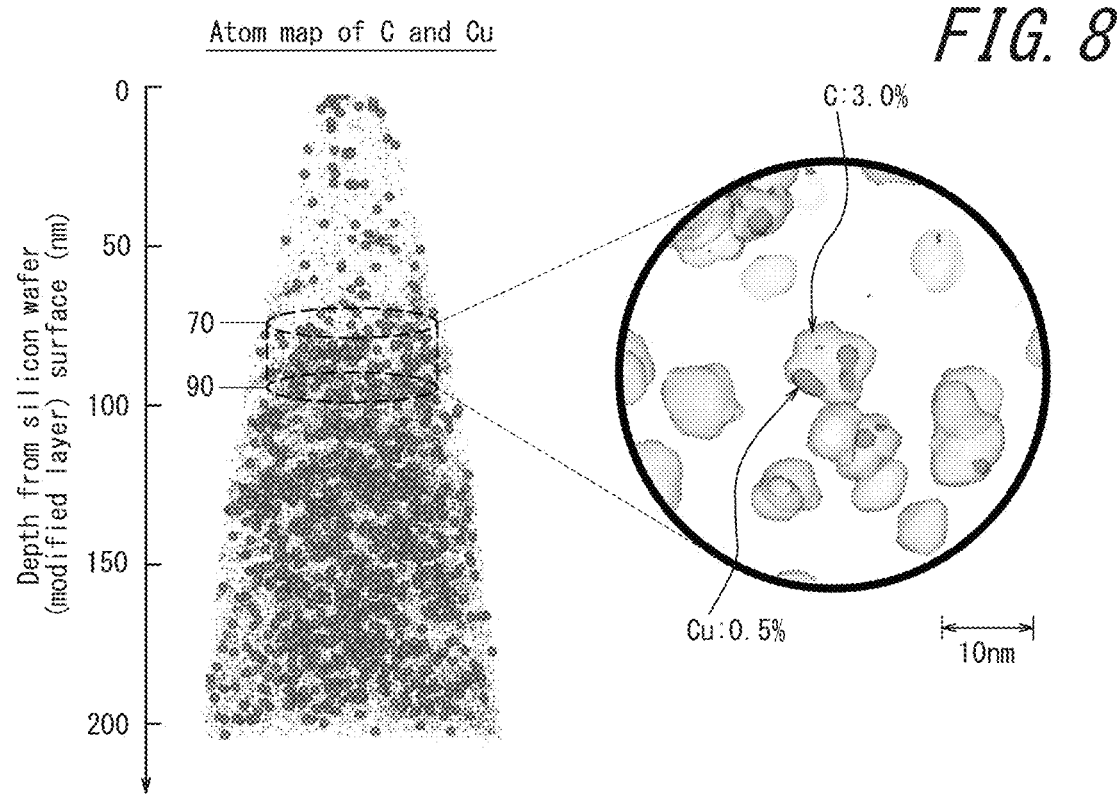
FIG. 8 is a diagram illustrating an isosbestic surfaces in which the concentration of C is 3.0% and isosbestic surfaces in which the concentration of Cu is 0.5% in the three-dimensional map of Experimental Example 3.

In an attempt to analyze the gettering state in more detail, we created isosbestic surfaces depicted in FIG. 8 based on the three-dimensional map presented in FIG. 7C. FIG. 8 is a diagram illustrating isosbestic surfaces in which the C concentration is 3.0% and isosbestic surfaces in which the Cu concentration is 0.5% when a cylindrical region with a height of 20 nm sampled from the depth of 70 nm to 90 nm from the tip of the needle shaped sample is viewed from the sample tip side. In the three-dimensional map, cubes each having a volume of 1 nm$^3$ which are referred to as voxels store concentration information of the elements. The outermost voxels of voxels having a C concentration of 3.0% are traced, thus an isosbestic surface in which the C concentration is 3.0% can be created. Similarly, the outermost voxels of voxels having a Cu concentration of 0.5% are traced, thus an isosbestic surface in which the Cu concentration is 0.5% can be created. As is apparent from FIG. 8, an isosbestic surface of 0.5% Cu concentration lies to be encompassed by an isosbestic surface of 3.0% C concentration. This demonstrates that Cu is segregated inside a spheroid formed by the isosbestic surface of 3.0% C concentration (the region in which the C concentration is 3.0% or more).

Figure 9:
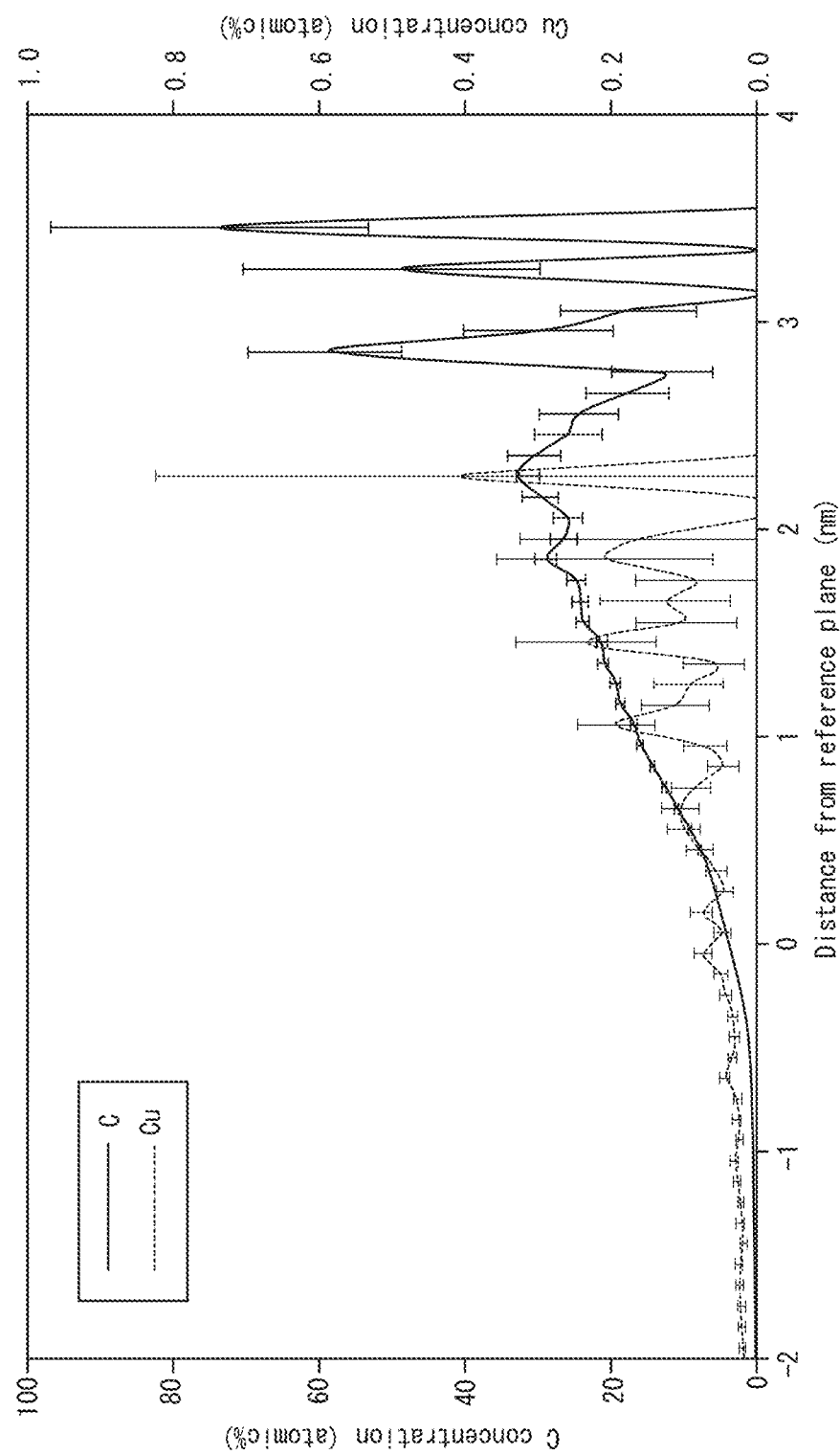
FIG. 9 is a proxygram of C and Cu using the isosbestic surface of 3.0% C concentration s a reference plane in Experimental Example 3.
Figure 12:
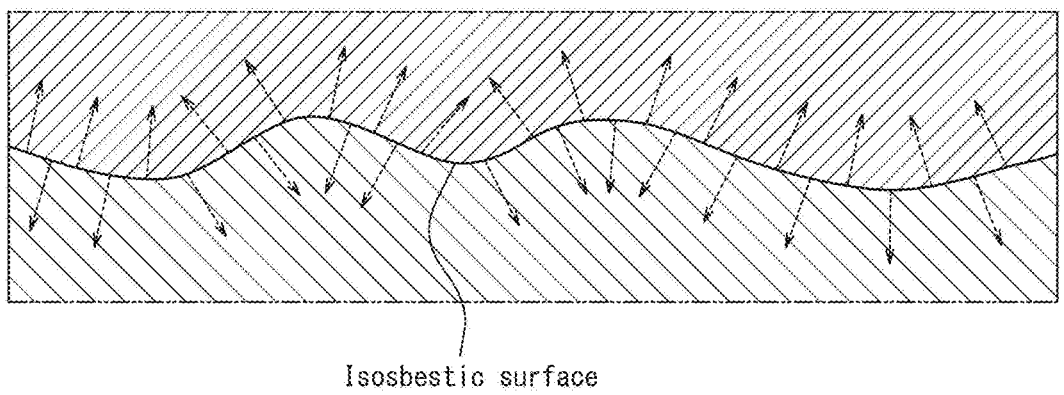
FIG. 12 is a conceptual diagram of a proxygram.

With a view to analyzing the gettering state in more detail, we created a proxygram of C and Cu as depicted in FIG. 9, using the isosbestic surface of 3.0% C concentration illustrated in FIG. 8 as a reference plane. With reference to FIG. 12, a proxygram is described as concentration profiles in which, using an isosbestic surface as a reference plane (distance: 0), the concentrations are calculated along with a direction perpendicular to the reference plane from each point on the reference plane. The proxygram allows for analysis of the concentration profiles excluding the influences of the interface roughness. In FIG. 9, the isosbestic surface of 3.0% C concentration is used as a reference plane; the plus direction on the horizontal axis corresponds to the inward direction of each spheroid formed by the isosbestic surface of 3.0% C concentration (i.e., the inside of the isosbestic surface), and the minus direction on the horizontal axis corresponds to the outward direction of each spheroid (i.e., the outside of the isosbestic surface). For example, at the position of 1 nm on the horizontal axis, the average, the maximum value, and the minimum value of the C concentration and the Cu concentration at a distance of 1 nm in the direction of the normal from each point on each reference plane (error bars) are depicted. As is also evident from FIG. 9, Cu is segregated inside each spheroid formed by the isosbestic surface of 3.0% C concentration (the region in which the C concentration is 3.0% or more).

Figure 10:
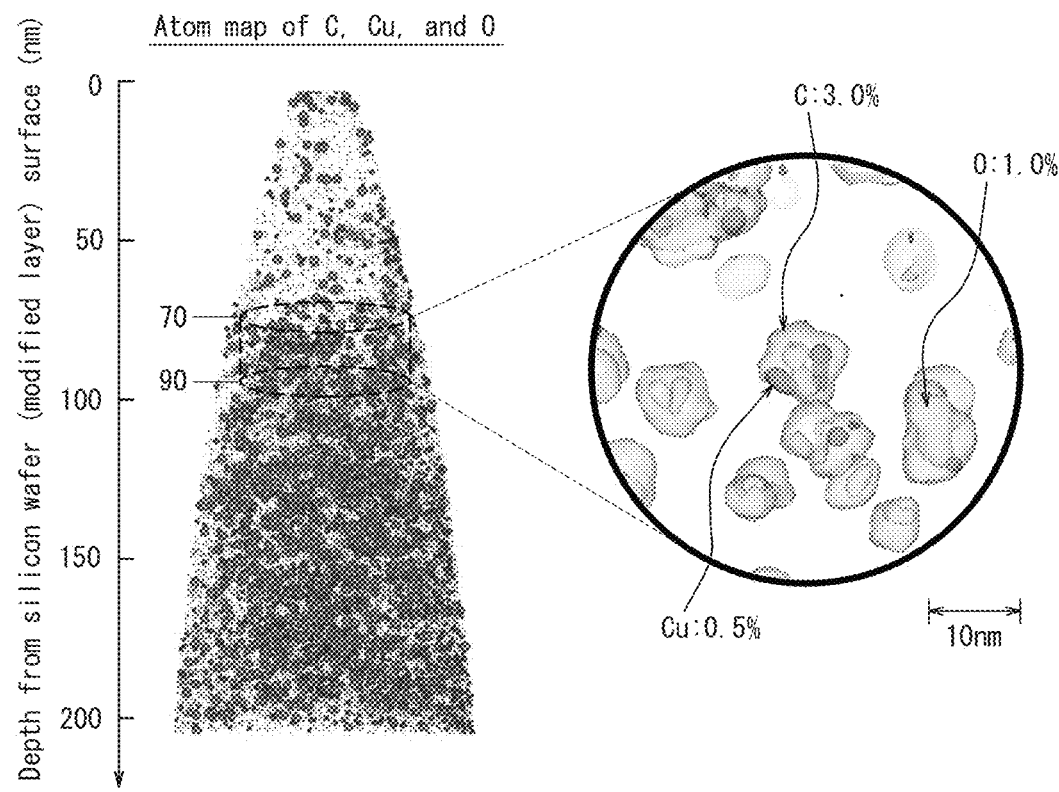
FIG. 10 is a diagram illustrating an isosbestic surface in which the concentration of C is 3.0%, an isosbestic surface in which the concentration of Cu is 0.5%, and an isosbestic surface in which the concentration of 0 is 1.0% in a three-dimensional map in Experimental Example 3.

We overlaid the three-dimensional oxygen map on the three-dimensional map of FIG. 7C, and created isosbestic surfaces depicted in FIG. 10 based on the resultant map. FIG. 10 is a diagram illustrating isosbestic surfaces in which the C concentration is 3.0%, isosbestic surfaces in which the Cu concentration is 0.5%, and isosbestic surfaces in which the O concentration is 1.0% when a cylindrical region with a height of 20 nm sampled from the depth of 70 nm to 90 nm from the tip of the needle shaped sample is viewed from the sample tip side. As is apparent from FIG. 10, not only an isosbestic surface of 0.5% Cu concentration but also an isosbestic surface of 1.0% O concentration lies to be encompassed by the isosbestic surface of 3.0% C concentration.

Figure 11:
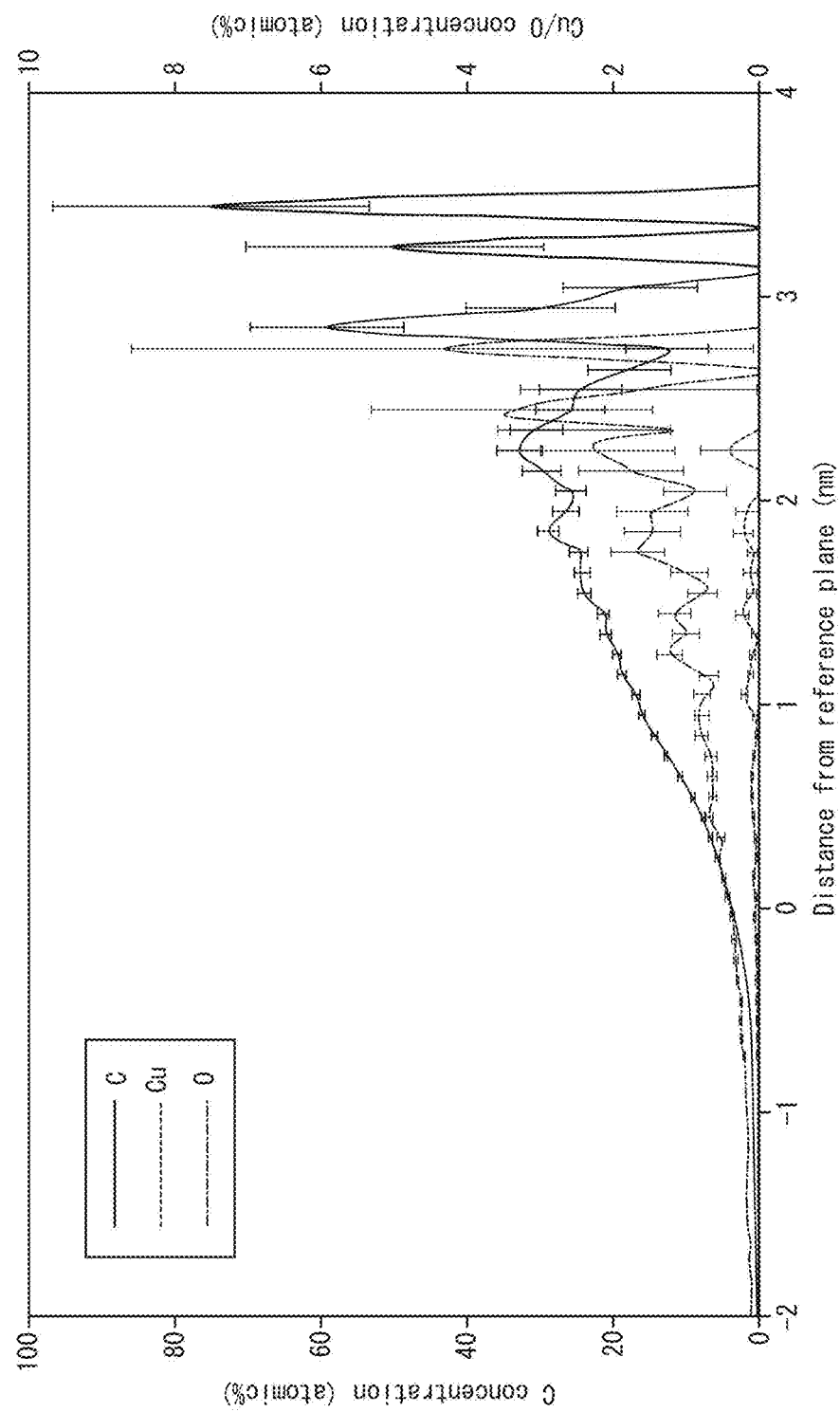
FIG. 11 is a proxygram of C, Cu, and O using the isosbestic surface of 3.0% C concentration as a reference plane in Experimental Example 3.

FIG. 11 is a proxygram of C, Cu, and O using the isosbestic surface of 3.0% C concentration illustrated in FIG. 10 as a reference plane. As is also evident from FIG. 11, Cu and O are segregated inside each spheroid formed by the isosbestic surface of 3.0% C concentration (the region in which the C concentration is 3.0% or more).

Method of Evaluating Gettering Capability

As demonstrated in Experimental Examples 1 to 3 above, the modified layer of each silicon wafer was analyzed by three-dimensional atom probe microscopy to obtain a three-dimensional map of carbon in the modified layer, and the impurity gettering capability of the modified layer can be evaluated based on the three-dimensional carbon map.

For a specific method, as illustrated in FIG. 3, carbon aggregates in a region ranging from the surface of the modified layer to a depth of 200 nm are identified on the three-dimensional map of carbon, the concentration profiles of carbon and an impurity in and around the carbon aggregates are obtained, and the impurity gettering capability of the modified layer can be evaluated based on the concentration profiles.

Further, as can be understood from the result depicted in FIG. 5, the impurity gettering capability of the modified layer can also be evaluated based on the density of the carbon aggregates. When the density of carbon aggregates is high, the gettering capability can be rated as high. This method renders it unnecessary to deliberately contaminate the silicon wafer with impurities such as heavy metals and to obtain atom maps of such impurities.

Further, as illustrated in FIG. 8 and FIG. 10, first isosbestic surfaces having a predetermined value of carbon concentration are created in a ranging from the surface of the modified layer to a depth of 200 nm in the three-dimensional carbon map, second isosbestic surfaces in which the impurity concentration is a predetermined value are created in the three-dimensional map, and the impurity gettering capability of modified layer can be evaluated based on the positional relationship between the first isosbestic surfaces and the second isosbestic surfaces. In Experimental Example 3, the C concentration was 3.0%, and for impurity concentrations, the Cu concentration was 0.5% and the O concentration was 1.0%; however, for example, the C concentration can be appropriately selected from the range of 0.1% to 50%, the Cu concentration: 0.1% to 5.%, and the O concentration: 0.1% to 5.0%, without limitation to the above concentrations.

Further, as illustrated in FIG. 9 and FIG. 11, first isosbestic surfaces having a predetermined value of carbon concentration are created in a region ranging from the surface of the modified layer to a depth of 200 nm in the three-dimensional carbon map, a proxygram of carbon and an impurity is created using at least one of the first isosbestic surfaces as a reference plane, and the impurity gettering capability of modified layer can be evaluated based on the proxygram.

Further, the results of Experimental Example 3 demonstrated that impurities were segregated inside each spheroid formed by the isosbestic surface of carbon. Accordingly, the impurity gettering capability of the modified layer can be evaluated based on the density of spheroids formed by isosbestic surfaces of carbon. This method renders it unnecessary to deliberately contaminate the silicon wafer with impurities such as heavy metals and to obtain atom maps of such impurities.

Preferred Embodiment

In Experimental Example 1 above, oxygen in the silicon wafer was focused as an impurity. Segregating oxygen in carbon aggregates in the modified layer can reduce diffusion of oxygen into the epitaxial layer, thus deterioration of device characteristics due to oxygen can be inhibited.

According to the studies made by the inventors of this disclosure, in terms of forming carbon aggregates, the conditions for heat treatment performed after the first step preferably include conditions of an ambient temperature of 900° C. or more and 1300° C. or less in a non-oxidizing atmosphere. The non-oxidizing atmosphere is desirably a hydrogen gas atmosphere, a nitrogen gas atmosphere, or an argon gas atmosphere. When the ambient temperature is less than 900° C., carbon aggregates are hardly formed in the silicon wafer, whereas when the ambient temperature exceeds 1300° C., the heat load on the apparatus is high and slips would be formed in the silicon wafer. In these terms, the ambient temperature is more preferably 1000° C. or more and 1250° C. or less.

Further, the heat treatment time is desirably 10 s or more and 2 h or less. When the heat treatment time is less than 10 s, carbon aggregates are hardly formed, whereas when heat treatment is performed for more than 2 h, carbon aggregates would not further increase, and in terms of saving heat treatment cost, heat treatment for 2 h or less is desirable. The heat treatment may be performed using a rapid heating/cooling apparatus or a batch heating apparatus (vertical heat treatment apparatus or horizontal heat treatment apparatus), and the heat treatment may be performed inside an epitaxial growth apparatus.

Such heat treatment conditions also suffice heat treatment in epitaxial growth. Specifically, in Experimental Examples 1 and 2 above, the silicon wafer having been subjected to ion implantation was subjected to a separate heat treatment without forming an epitaxial layer. However, as demonstrated in Experimental Example 3, carbon aggregates are formed even in an epitaxial silicon wafer in which an epitaxial layer is formed on a silicon wafer having been subjected to ion implantation. Note that according to a processing technique using a focused ion beam, a part of a modified layer can be processed into a needle shaped sample after removing the epitaxial layer.

In Experimental Example 1 above, oxygen in the silicon wafer was focused as an impurity. However, in this disclosure, the impurity is not limited to oxygen, and the same results can be obtained in the case of a heavy metal as demonstrated in Experimental Example 3. Specifically, after the epitaxial silicon wafer is subjected to forced contamination with a heavy metal, its modified layer is analyzed by 3DAP microscopy, and carbon aggregates in a region ranging from the surface of the modified layer to a depth of 200 nm are identified in a three-dimensional map of carbon, and the concentration profiles of carbon and the heavy metal in and around the carbon aggregates are obtained, thus the gettering behavior of the modified layer for the heavy metal can be evaluated.

Epitaxial Silicon Wafer

An epitaxial silicon wafer of this embodiment includes a silicon wafer; a modified layer located in a surface portion of the silicon wafer, the modified layer containing carbon in solid solution in the silicon wafer; and an epitaxial layer located on the modified layer. In a three-dimensional map obtained by analyzing the modified layer by three-dimensional atom probe microscopy, carbon aggregates are present in a region ranging from a surface of the modified layer to a depth of 200 nm, a mean diameter of the carbon aggregates is 5 nm or more, and a density of the carbon aggregates is $1 \times 10^{15}/cm^3$ or more.

As can be seen, a high impurity gettering capability can be obtained by setting the mean diameter and the density of carbon aggregates in a modified layer to at least predetermined values.

For the conditions for producing an epitaxial silicon wafer of this embodiment, irradiation conditions of the dose, the cluster species, the acceleration voltage, the beam current, etc. are appropriately selected based on the cluster ion irradiation conditions employed in the above experimental examples, and the correlation between the size and the density of the carbon aggregates obtained by the combination of the selected cluster ion irradiation conditions and the heat treatment conditions is previously determined, thus an epitaxial silicon wafer of this embodiment can be produced.

INDUSTRIAL APPLICABILITY

The disclosed evaluation method allows for very precise evaluation of the impurity gettering behavior of a modified layer formed immediately under an epitaxial layer, the modified layer containing carbon in solid solution, thus epitaxial silicon wafers used as material wafers for fabricating various kinds of semiconductor devices such as solid-state imaging devices can be adequately evaluated.

The invention claimed is:
1. A method of evaluating an impurity gettering capability of an epitaxial silicon wafer produced through:
   implanting ions containing carbon through a surface of a silicon wafer to form a modified layer in a surface portion of the silicon wafer, the modified layer containing carbon in solid solution, and
   forming an epitaxial layer on the modified layer of the silicon wafer,
   the method comprising:
   subjecting the silicon wafer to a heat treatment after the implanting,
   then analyzing the modified layer of the silicon wafer by a three-dimensional atom probe microscopy to obtain a three-dimensional map of carbon in the modified layer, and
   evaluating an impurity gettering capability of the modified layer based on the three-dimensional map of carbon.
2. The method according to claim 1, comprising:
   identifying carbon aggregates in a region ranging from a surface of the modified layer to a depth of 200 nm on the three-dimensional map of carbon,
   obtaining concentration profiles of carbon and an impurity in and around the carbon aggregates, and
   evaluating the impurity gettering capability of the modified layer based on the concentration profiles.
3. The method according to claim 1, comprising:
   identifying carbon aggregates in a region ranging from a surface of the modified layer to a depth of 200 nm on the three-dimensional map of carbon, and
   evaluating the impurity gettering capability of the modified layer based on a density of the carbon aggregates.
4. The method according to claim 1, comprising:
   creating first isosbestic surfaces having a predetermined value of carbon concentration in a region ranging from a surface of the modified layer to a depth of 200 nm on the three-dimensional map of carbon,
   creating second isosbestic surfaces having a predetermined value of an impurity concentration on the three-dimensional map, and
   evaluating the impurity gettering capability of the modified layer based on a positional relationship between the first isosbestic surfaces and the second isosbestic surfaces.
5. The method according to claim 1, comprising:
   creating first isosbestic surfaces having a predetermined value of carbon concentration in a region ranging from a surface of the modified layer to a depth of 200 nm on the three-dimensional map of carbon, creating a proxygram of carbon and an impurity using at least one of the first isosbestic surfaces as a reference plane, and evaluating the impurity gettering capability of the modified layer based on the proxygram.

6. The method according to claim 1, comprising:

creating first isosbestic surfaces having a predetermined value of carbon concentration in a region ranging from a surface of the modified layer to a depth of 200 nm on the three-dimensional map of carbon, and evaluating the impurity gettering capability of the modified layer based on a density of spheroids formed by the first isosbestic surfaces.

7. The method according to claim 1, wherein the impurity is a heavy metal element.

8. The method according to claim 1, wherein the heat treatment is performed under conditions of 900° C. or more and 1300° C. or less in a non-oxidizing atmosphere.

9. The method according to claim 1, wherein the heat treatment is a heat treatment performed for the epitaxial growth in the forming of the epitaxial layer.

10. The method according to claim 1, wherein the ions containing carbon are cluster ions containing carbon and hydrogen.

11. An epitaxial silicon wafer comprising:

a silicon wafer;

a modified layer located in a surface portion of the silicon wafer, the modified layer containing carbon in solid solution within the silicon wafer; and an epitaxial layer located on the modified layer, wherein in a three-dimensional map of carbon obtained by analyzing the modified layer by a three-dimensional atom probe microscopy, carbon aggregates are present in a region ranging from a surface of the modified layer to a depth of 200 nm, a mean diameter of the carbon aggregates is 5 nm or more, and a density of the carbon aggregates is $1 \times 10^{15}/cm^3$ or more.

* * * * *